United States Patent
Weyant et al.

(10) Patent No.: US 10,928,139 B1
(45) Date of Patent: Feb. 23, 2021

(54) ASSEMBLY AND PROCESS FOR HEAT TRANSFER WITH THREE SURFACES

(71) Applicant: ADVANCED COOLING TECHNOLOGIES, INC., Lancaster, PA (US)

(72) Inventors: Jens E. Weyant, Hershey, PA (US); Scott D. Garner, Lititz, PA (US)

(73) Assignee: ADVANCED COOLING TECHNOLOGIES, INC., Lancaster, PA (US)

( * ) Notice: Subject to any disclaimer, the term of this patent is extended or adjusted under 35 U.S.C. 154(b) by 628 days.

(21) Appl. No.: 14/304,094

(22) Filed: Jun. 13, 2014

Related U.S. Application Data

(60) Provisional application No. 61/866,602, filed on Aug. 16, 2013.

(51) Int. Cl.
  *H05K 7/14* (2006.01)
  *F28D 15/02* (2006.01)
  *H05K 7/20* (2006.01)

(52) U.S. Cl.
  CPC ......... *F28D 15/02* (2013.01); *F28D 15/0275* (2013.01); *H05K 7/1404* (2013.01); *H05K 7/20545* (2013.01)

(58) Field of Classification Search
  CPC ............. H05K 7/1404; H05K 7/20545; H05K 7/2049; H05K 7/1407; F28D 15/02; F28D 15/0275
  USPC .................................. 361/700, 704, 719, 720
  See application file for complete search history.

(56) References Cited

U.S. PATENT DOCUMENTS

| | | | |
|---|---|---|---|
| 4,971,570 A | 11/1990 | Tolle et al. | |
| 6,839,235 B2 | 1/2005 | St Louis et al. | |
| 6,873,528 B2 | 3/2005 | Hulan et al. | |
| 7,193,850 B2 | 3/2007 | Pal | |
| 7,349,221 B2 | 3/2008 | Yurko | |
| 7,483,271 B2 | 1/2009 | Miller et al. | |
| 7,515,418 B2 | 4/2009 | Straznicky et al. | |
| 8,223,494 B2* | 7/2012 | Bult ..................... | H05K 7/1404 165/104.33 |
| 8,233,279 B2 | 7/2012 | Sporer | |
| 8,427,828 B2 | 4/2013 | Kehret et al. | |
| 2006/0109631 A1 | 5/2006 | Marro et al. | |

(Continued)

FOREIGN PATENT DOCUMENTS

| | | |
|---|---|---|
| EP | 2061296 A1 | 5/2009 |
| EP | 2131640 A1 | 12/2009 |

(Continued)

*Primary Examiner* — Eric S Ruppert
(74) *Attorney, Agent, or Firm* — McNees Wallace & Nurick LLC

(57) ABSTRACT

A heat transfer assembly includes a movable heat transfer device in contact with a heat sink and a conduction card in contact with the heat sink, the conduction card being thermally connected to the movable heat transfer device. The movable heat transfer device contacts at least two surfaces of the heat sink, is a condenser, includes at least one non-perpendicular angle, or a combination thereof. The conduction card contacts at least one surface of the heat sink, includes at least one non-perpendicular angle, or a combination thereof. The heat transfer assembly contacts at least three surfaces of the heat sink.

20 Claims, 7 Drawing Sheets

(56) References Cited

U.S. PATENT DOCUMENTS

| | | | | |
|---|---|---|---|---|
| 2007/0253169 | A1* | 11/2007 | Clawser | H05K 7/1404 |
| | | | | 361/720 |
| 2008/0087406 | A1* | 4/2008 | Asfia | F28D 15/0233 |
| | | | | 165/104.29 |
| 2010/0002395 | A1* | 1/2010 | Bertrou | H05K 7/20672 |
| | | | | 361/700 |
| 2010/0020514 | A1* | 1/2010 | Lee | H05K 7/1404 |
| | | | | 361/801 |
| 2012/0087089 | A1* | 4/2012 | Monson | H05K 7/20545 |
| | | | | 361/700 |

FOREIGN PATENT DOCUMENTS

| | | | |
|---|---|---|---|
| EP | 2355643 | B1 | 10/2011 |
| EP | 2274965 | B1 | 3/2013 |
| WO | 2012050995 | A1 | 4/2012 |

* cited by examiner

ASSEMBLY AND PROCESS FOR HEAT TRANSFER WITH THREE SURFACES

FIELD OF THE INVENTION

The present invention is directed to heat transfer systems and processes. More particularly, the present invention is directed to heat transfer between a heat sink and a heat transfer arrangement and a conduction card.

BACKGROUND OF THE INVENTION

Heat transfer of conduction cards and corresponding assemblies is desirable for operational purposes. In many cases, electronics are mounted to conduction cards which act as a mechanical support and to dissipate thermal input. A conduction card with an electronic assembly is inserted into a slot within a rack, which is known as a chassis. The conduction card is locked into the chassis with a wedge lock clamping mechanism to mechanically secure the conduction card and to thermally link the conduction card to the chassis. The chassis acts as the ultimate heat sink for the system. The mechanical joint between the conduction card and the chassis/heat sink remains a major thermal bottle neck.

Heat pipes or other mechanisms, such as, thermally conductive materials, can be used for transferring heat in conduction cards. Known processes are limited in the amount of surface area thermally connected between the heat sinks and conduction cards. Such surface areas have been increased but a desire to increase such surface areas remain. Limitations, such as, mechanical limitations, cost-effectiveness, and heat transfer efficiency, have limited the effectiveness of such increases. However, known systems have been considered desirable because such arrangements are easily operable with existing condenser and conduction card geometries.

In one system, heat is transferred from a conduction card to two surfaces of a heat sink through forces exerted in opposite directions from a wedge lock mechanism to result in a conduction card and a condenser contacting the heat sink. The system is capable of operation with existing condenser and conduction card geometries and allows heat to be transferred directly with the heat sink. However, such arrangements are mechanically limited to providing heat transfer to no more than two surfaces.

In another system, heat is transferred in a plurality of directions from a spiral lock. The spiral lock exerts substantially omni-directional force, permitting a conduction card to contact one surface of a heat sink while the spiral lock contacts two other surfaces of the heat sink. The system is capable of operation with existing condenser and conduction card geometries. However, the spiral lock is complicated, includes several parts, can be expensive, and does not involve direct contact between a condenser and a heat sink.

A heat transfer assembly, a heat transfer process, and a process of assembling a heat transfer assembly that do not suffer from one or more of the above drawbacks would be desirable in the art.

BRIEF DESCRIPTION OF THE INVENTION

In an exemplary embodiment, a heat transfer assembly includes a movable heat transfer device in contact with a heat sink and a conduction card in contact with the heat sink, the conduction card being thermally connected to the movable heat transfer device. The movable heat transfer device contacts at least two surfaces of the heat sink, is a condenser, includes at least one non-perpendicular angle, or a combination thereof. The conduction card contacts at least one surface of the heat sink, includes at least one non-perpendicular angle, or a combination thereof. The heat transfer assembly contacts at least three surfaces of the heat sink.

In another exemplary embodiment, a heat transfer assembly includes a conduction card and a condenser thermally connected to the conduction card. One or both of the conduction card and the condenser include at least one non-perpendicular angle. The heat transfer assembly contacts at least three surfaces of the heat sink.

In another exemplary embodiment, a process of assembling a heat transfer system includes positioning a conduction card and a movable heat transfer device proximal to a heat sink, the conduction card being thermally connected to the movable heat transfer device, and contacting at least three surfaces of the heat sink with a combination of the conduction card and the movable heat transfer device. The conduction card contacts at least one surface of the heat sink, includes at least one non-perpendicular angle, or a combination thereof.

In another exemplary embodiment, a heat transfer process includes providing a heat transfer assembly comprising a conduction card and a movable heat transfer device proximal to a heat sink, the conduction card being thermally connected to the movable heat transfer device, and transferring heat through at least three surfaces of the heat sink with a combination of the conduction card and the movable heat transfer device. The conduction card contacts at least one surface of the heat sink, includes at least one non-perpendicular angle, or a combination thereof.

Other features and advantages of the present invention will be apparent from the following more detailed description of the preferred embodiment, taken in conjunction with the accompanying drawings which illustrate, by way of example, the principles of the invention.

BRIEF DESCRIPTION OF THE DRAWINGS

Wherever possible, the same reference numbers will be used throughout the drawings to represent the same parts.

DETAILED DESCRIPTION OF THE INVENTION

Provided is a heat transfer assembly, a heat transfer process, and a process of assembling a heat transfer assembly. Embodiments of the present disclosure, in comparison to similar concepts that do not include one or more of the features disclosed herein, increase heat transfer by increasing surface area or surfaces in contact, increase the number of surfaces in contact, direct heat in three or more distinguishable directions and/or paths, overcome mechanical limitations, decrease costs, extend the operational life of such systems, increase heat transfer efficiency, rely upon fewer parts, permit direct contact between a heat sink and a heat transfer device and/or a conduction card, decrease temperature drop caused by metal-to-metal contact resistance, other improvements and advantages, and combinations thereof.

Figure 1:
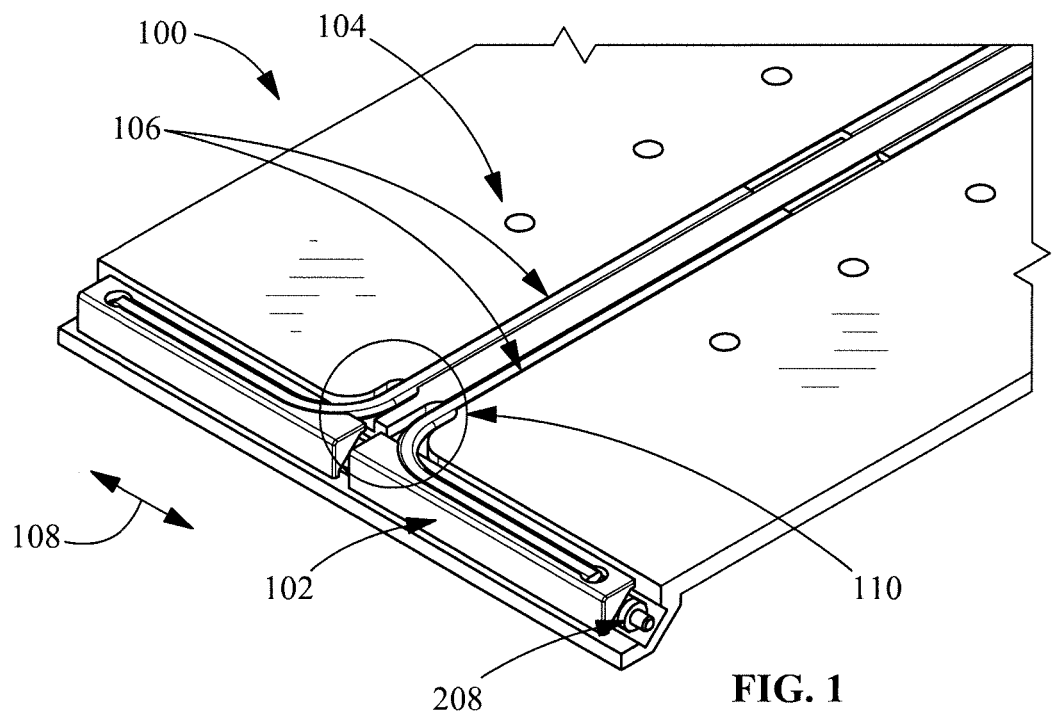
FIG. 1 is a perspective view of an embodiment of a heat transfer assembly, according to the disclosure.

FIG. 1 shows an embodiment of a heat transfer assembly 100. The heat transfer assembly 100 includes a movable heat transfer device 102 and a conduction card 104, for example, being aluminum, copper, or any conductive material. As used herein, the term "conduction card" refers to a rigid or substantially rigid device capable of being inserted into a slot, for example, of a heat sink. Suitable conduction cards include, but are not limited to, circuit boards (for example, printed circuit boards), heat spreaders, electronic components, circuits, or combinations thereof. In general, suitable conduction cards generate heat or receive heat during operation of an electronic system, for example, from a heat-generating component.

Figure 2:
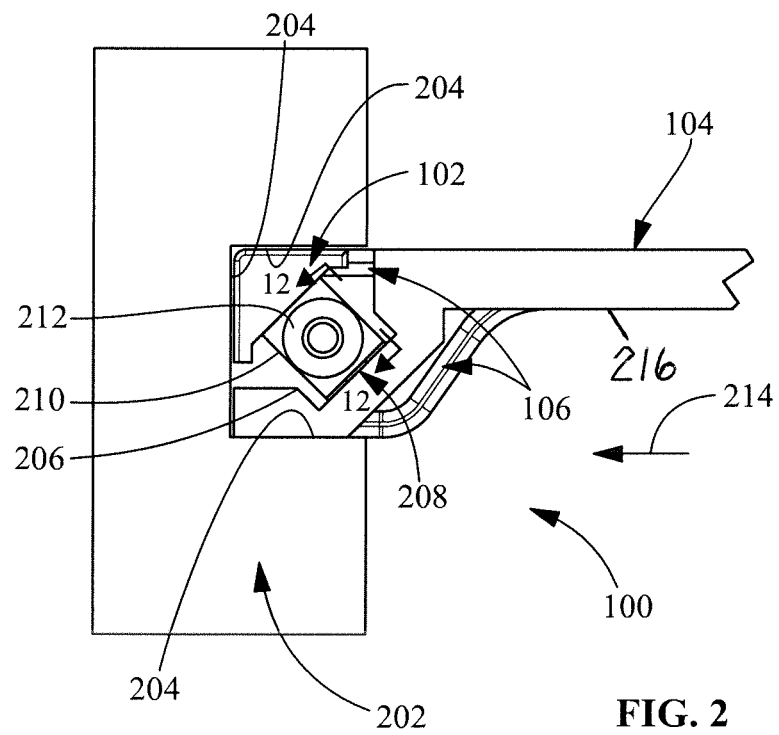
FIG. 2 is a side schematic view of an embodiment of a heat transfer assembly inserted into a heat sink, according to the disclosure.

The conduction card 104 is thermally connected to the movable heat transfer device 102, for example, by one or more thermal siphon or transport devices 106, partially within the movable heat transfer device 102 and/or the conduction card 104 (for example, in grooves or slots) and/or in contact with the movable heat transfer device 102 and/or the conduction card 104. As shown in FIG. 2, the movable heat transfer device 102 and the conduction card 104 are in contact with a heat sink 202. Thermal siphon devices or thermal transport devices transports 106 may be, but are not limited to, devices that transport thermal energy using latent heat, constant conductance heat pipes (CCHPs), thermosiphons, loop heat pipes, or any passive, two-phase device.

Referring again to FIG. 1, the movable heat transfer device 102 is capable of being adjusted in all directions, including, but not limited to, a lateral direction 108, relative to the conduction card 104. The adjustments are capable due to, for example, flexible regions 110 between the conduction card 104 and the movable heat transfer device 102. In one embodiment, the flexible regions 110 are part of the heat pipe 106 extending into the movable heat transfer device 102 to the conduction card 104. The remaining portions of the heat pipe 106 are flexible or rigid. In other embodiments, the flexible regions 110 are extensions of the heat pipe 106, are metal or otherwise thermally conductive materials, or a combination thereof.

Figure 3:
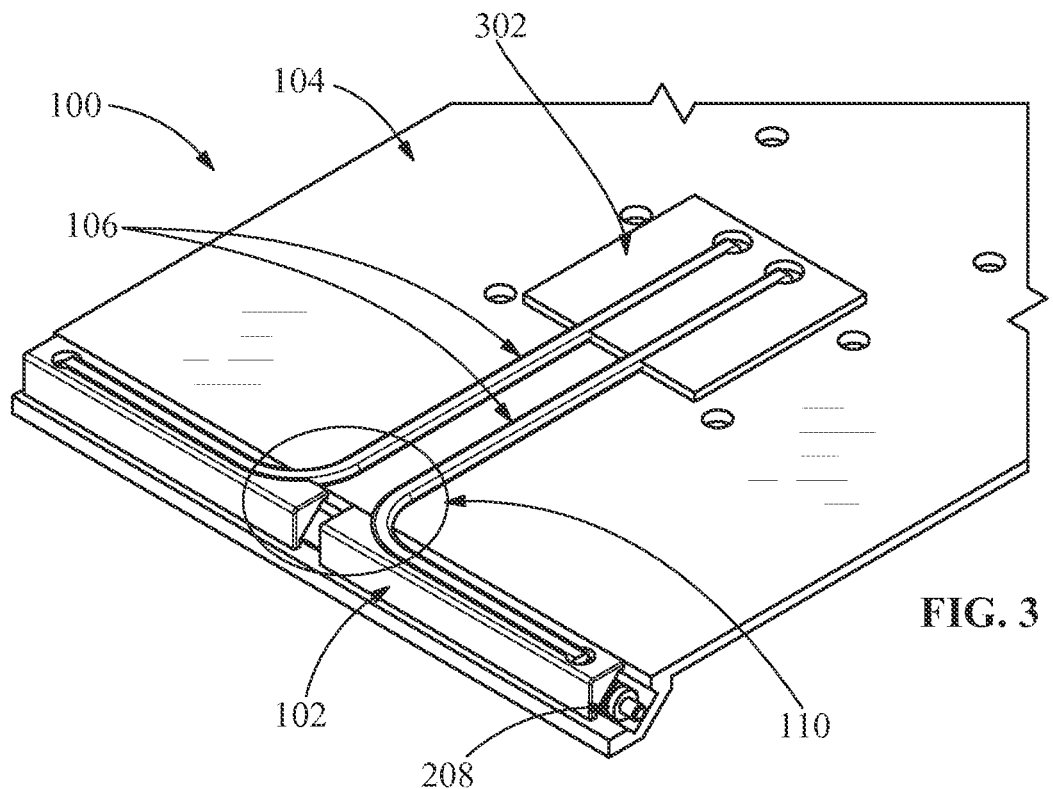
FIG. 3 is a perspective view of an embodiment of a heat transfer assembly, according to the disclosure.
Figure 4:
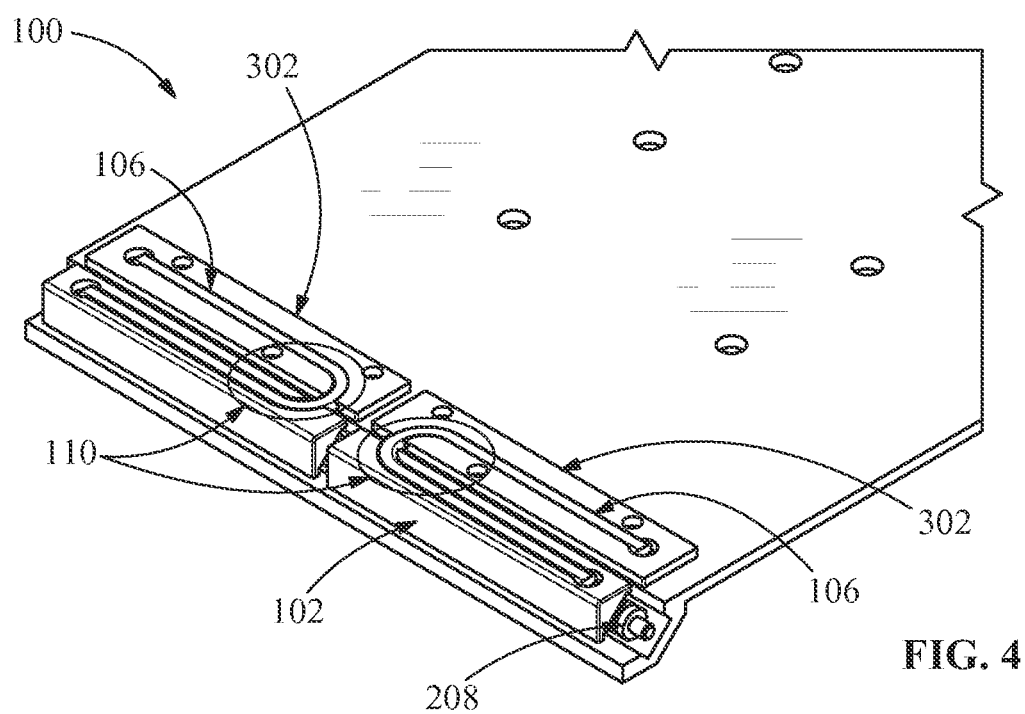
FIG. 4 is a perspective view of an embodiment of a heat transfer assembly, according to the disclosure.

The heat transfer assembly 100 includes any other suitable features, depending upon the specific application. For example, as shown in FIGS. 3 and 4, in one embodiment, the heat pipes 106 extend indirectly (see FIG. 3) or directly (see FIG. 4) to an evaporator 302 on the conduction card 104. The evaporator 302 is secured to the conduction card 104 and/or to a heat-generating component (not shown) by any suitable mechanism, for example, being bolted on, being adhesively coupled, being soldered, or through any other suitable technique. As shown in FIG. 3, in one embodiment, the evaporator 302 is a plate positioned apart from the movable heat transfer device 102. As shown in FIG. 4, in one embodiment, the evaporator 302 is a plurality of plates positioned to be proximate to or abut the movable heat transfer device 102.

Referring again to FIG. 2, the movable heat transfer device 102 contacts at least two surfaces 204 of the heat sink 202, is a condenser, includes at least one non-perpendicular angle 206 for receiving a multi-directional force-providing mechanism, or a combination thereof. The conduction card 104 contacts at least one of the surfaces 204 of the heat sink 202, includes at least one of the non-perpendicular angles 206, or a combination thereof. As a whole, the heat transfer assembly 100 contacts at least three of the surfaces 204 of the heat sink 202.

Figure 5:
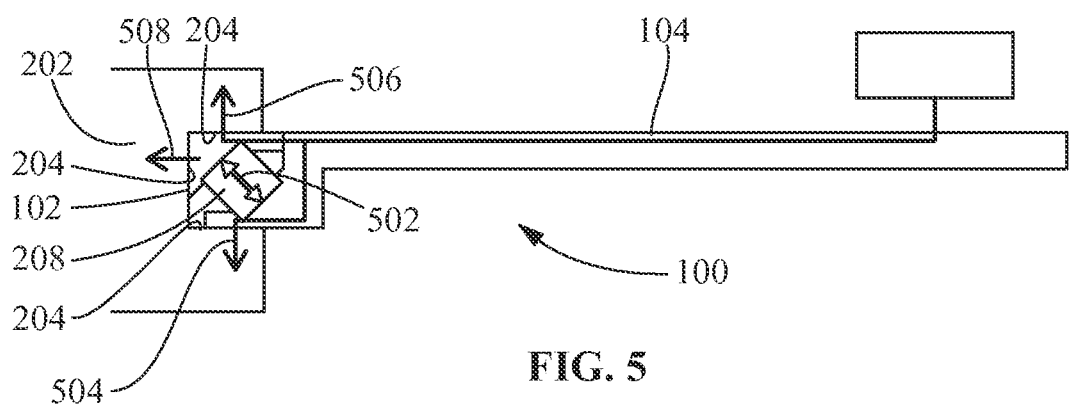
FIG. 5 is a side schematic view of an embodiment of a heat transfer assembly inserted into a heat sink with a condenser contacting two surfaces of the heat sink, according to the disclosure.

In the embodiment shown in FIG. 5, the heat transfer member 102 contacts first and second surfaces 204, and conduction card 104 contacts a third surface 204. This allows the heat to be transferred from the conduction card 104 to the heat sink 202 through the heat transfer member 102 and the conduction card 104. This eliminates or significantly reduces the amount of heat which is transferred through the force providing mechanism 208. Alternatively, the conduction card 104 may contact more than one surface 204 of the heat sink 202 to dissipate the heat generated on the conduction card 104.

Figure 12:
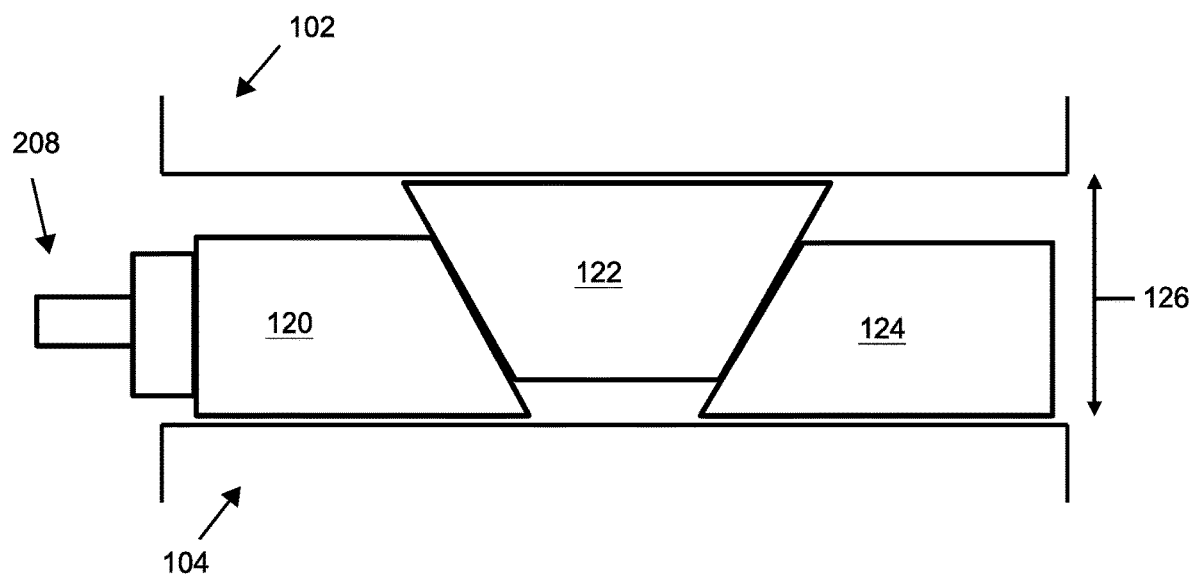
FIG. 12 is a view of an exemplary multi-directional force providing mechanism taken along line 12-12 of the heat transfer assembly of FIG. 2.

Referring to FIG. 2, the multi-directional force-providing mechanism 208 is any suitable mechanism capable of exerting force in at least two distinguishable directions. In one embodiment, the multi-directional force-providing mechanism 208 includes features described in U.S. patent application Ser. No. 13/385,235, which is hereby incorporated by reference in its entirety. Additionally or alternatively, in one embodiment, the clamping mechanism is any suitable component, such as a wedge lock clamping mechanism, capable of expanding in two directions. In one embodiment, the multi-directional force-providing mechanism 208 includes an external contact region 210 for contacting the movable heat transfer device 102 and/or the conduction card 104. In addition, the multi-directional force-providing mechanism 208 includes an internal mechanism 212 permitting the multi-directional force-providing mechanism 208 to selectively or automatically exert a force upon the external contact region 210 and, thus, to temporarily or permanently secure the multi-directional force-providing mechanism 208 in contact with the moveable heat transfer device 102 and/or the conduction card 104. An exemplary embodiment of multi-directional force-providing mechanism 208 is shown in FIG. 12 that is taken along line 12-12 of heat transfer assembly 100. As shown in FIG. 12, multi-directional force-providing mechanism 208 comprises movable clamping parts 120, 122, 124. In response to clamping parts 120 and 124 being brought toward each other, clamping parts 120, 122, 124 expand in directions 126.

The multi-directional force-providing mechanism 208 is oriented to operate in conjunction with the non-perpendicular angle(s) 206 of the movable heat transfer device 102 and/or the conduction card 104. For example, in one embodiment, with the multi-directional force-providing mechanism 208 having a geometry of a square, the multi-directional force-providing mechanism 208 is oriented as a diamond, as is shown in FIG. 2 (for example, 45 degrees from being oriented as a square), relative to the plane corresponding to an insertion direction 214 for the heat transfer assembly 100 that is parallel to a surface 216 of conduction card 104. In other embodiments, the multi-directional force-providing mechanism 208 is oriented at any suitable angle relative to the insertion direction 214 to exert force evenly or disproportionately. Suitable angles include, but are not limited to, between 10 degrees and 80 degrees, between 15 degrees and 75 degrees, between 30 degrees and 60 degrees, between 30 degrees and 45 degrees, between 45 degrees and 60 degrees, at or about 10 degrees, at or about 15 degrees, at or about 30 degrees, at or about 45 degrees, at or about 60 degrees, at or about 75 degrees, at or about 80 degrees, or any suitable combination, sub-combination, range, or sub-range therein.

Figure 6:
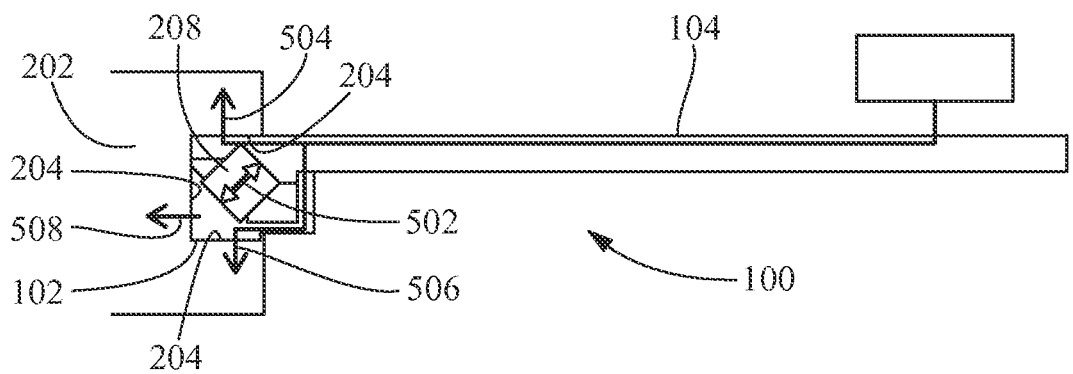
FIG. 6 is a side schematic view of an embodiment of a heat transfer assembly inserted into a heat sink with a condenser contacting two surfaces of the heat sink, according to the disclosure.

The geometry of the components of the heat transfer assembly 100 allows force from one or two directions to urge each of the components in a plurality of directions. For example, in some embodiments, as shown in FIGS. 5-6, an outward bi-directional force 502 is oriented to urge the conduction card 104 in a first direction 504 to directly or indirectly contact one of the surfaces 204 of the heat sink 202 and urge the movable heat transfer device 102 in a second direction 506 and a third direction 508 to directly or indirectly contact two of the surfaces 204 of the heat sink 202. The bi-directional force 502 is not parallel with first direction 504, the second direction 506, and the third direction 508. The first direction 504, the second direction 506, and the third direction 508 each extend distinguishably and are, for example, perpendicular or opposite one another. As will be appreciated, the relative orientation of the bi-directional forces, the geometry of the movable heat transfer device 102, the geometry of the conduction card 104, the geometry of the multi-directional force-providing mechanism 208, or the geometry of other components are capable of being adjusted to distribute forces, and thus, heat transfer capabilities, as desired.

Figure 7:
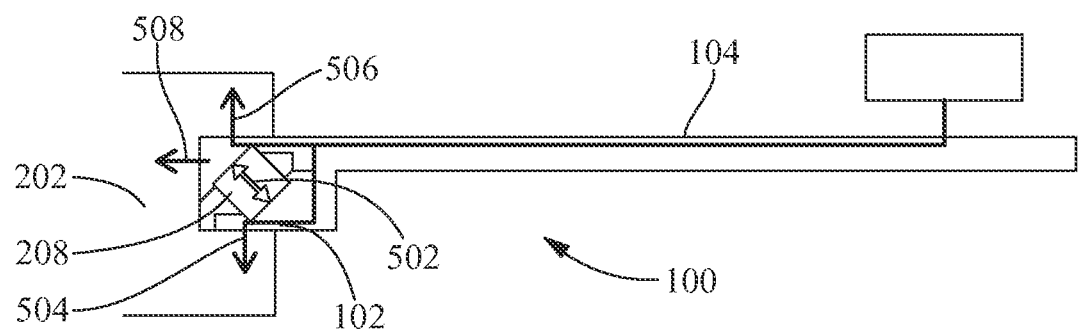
FIG. 7 is a side schematic view of an embodiment of a heat transfer assembly inserted into a heat sink with a conduction card contacting two surfaces of the heat sink, according to the disclosure.
Figure 8:
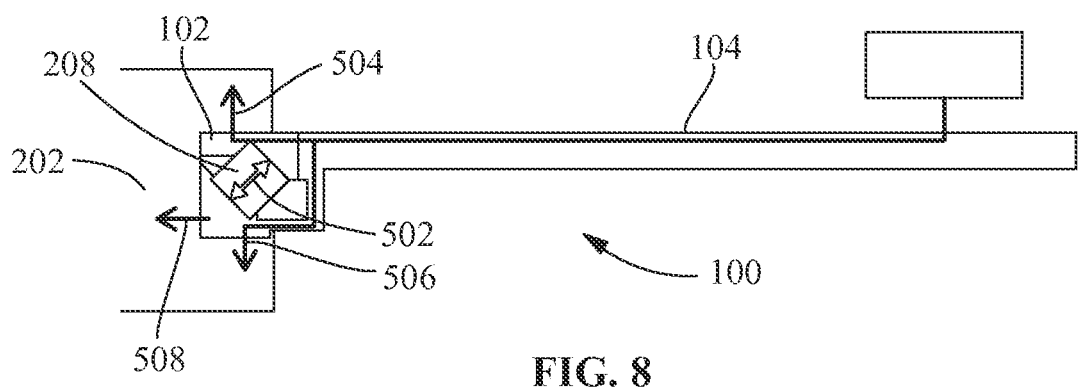
FIG. 8 is a side schematic view of an embodiment of a heat transfer assembly inserted into a heat sink with a conduction card contacting two surfaces of the heat sink, according to the disclosure.

Additionally or alternatively, in some embodiments, as shown in FIGS. 7-8, the outward bi-directional force 502 is oriented to urge the movable heat transfer device 102 in the first direction 504 to directly or indirectly contact one of the surfaces 204 of the heat sink 202 and urge the conduction card 104 in the second direction 506 and the third direction 508 to directly or indirectly contact two of the surfaces 204 of the heat sink 202.

Figure 9:
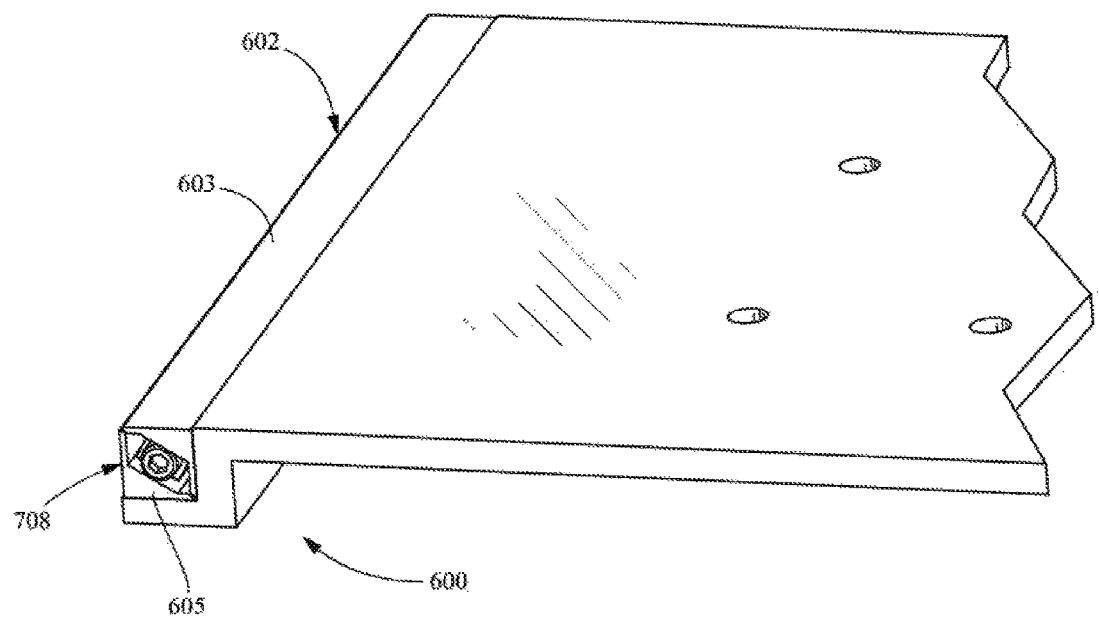
FIG. 9 is a perspective view of an embodiment of a heat transfer assembly, according to the disclosure.
Figure 10:
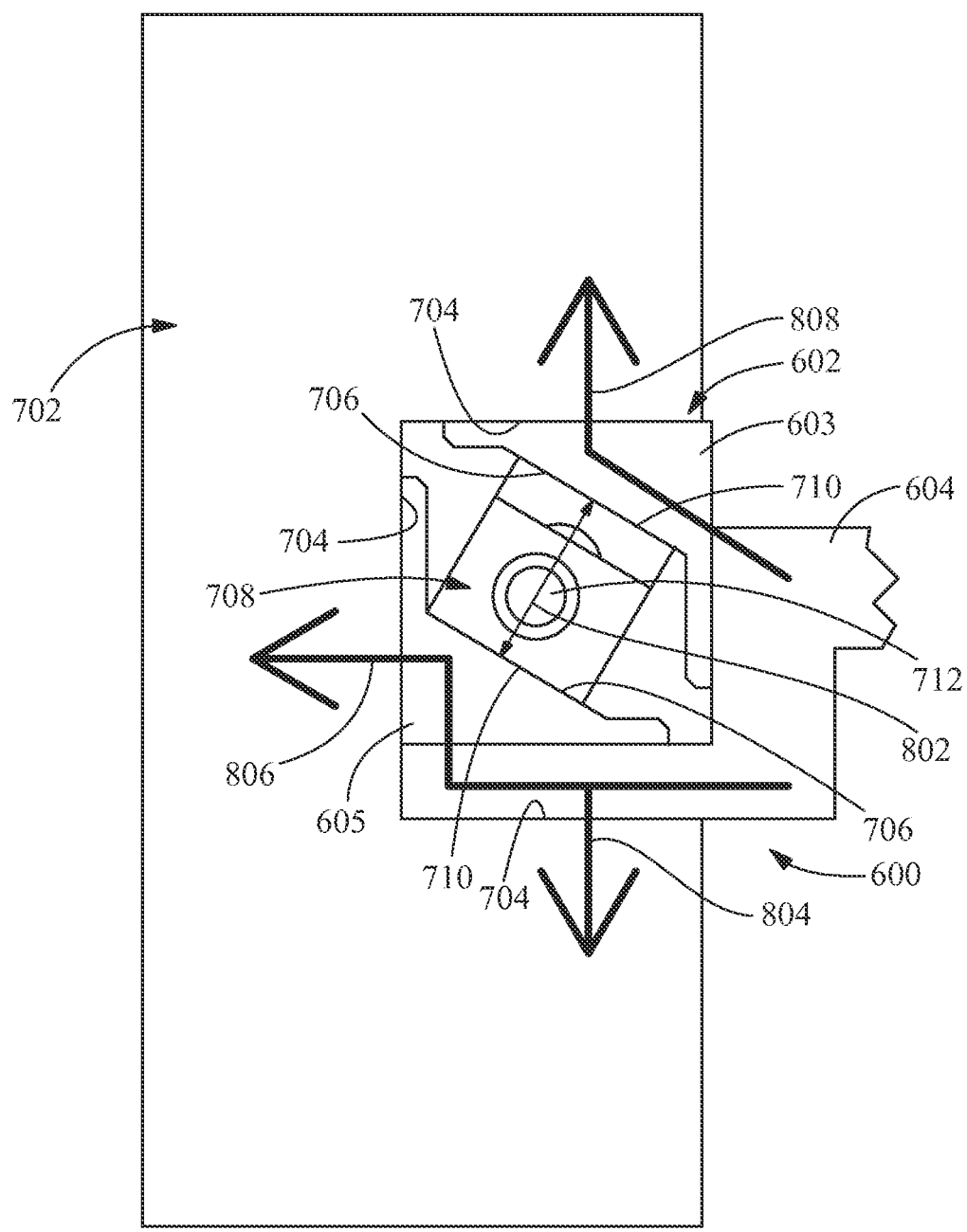
FIG. 10 is a side schematic view of an embodiment of a heat transfer assembly inserted into a heat sink with a condenser contacting two surfaces of the heat sink, according to the disclosure.

FIGS. 9 through 10 show an embodiment of a heat transfer assembly 600. The heat transfer assembly 600 includes a movable heat transfer device 602 and a conduction card 604, for example, being aluminum or copper.

The conduction card 604 is positioned in thermal engagement with the moveable heat transfer device 602. While not shown, the conduction card 604 may be thermally connected to the moveable heat transfer device 602 by heat pipes, similar to that shown in FIGS. 1-4. As shown in FIG. 10, the movable heat transfer device 602 and the conduction card 604 are in contact with a heat sink 702.

Referring again to FIG. 10, the movable heat transfer device 602 contacts at least two surfaces 704 of the heat sink 702, is a condenser, includes at least two heat transfer members 603, 605 each with at least one non-perpendicular angle 706 for cooperating with a clamping or multi-directional force-providing mechanism 708, or a combination thereof. The conduction card 604 contacts at least one of the surfaces 704 of the heat sink 702. As a whole, the heat transfer assembly 600 contacts at least three of the surfaces 704 of the heat sink 702. In the embodiment shown, heat transfer member 603 contacts a first surface 704, heat transfer member 605 contacts a second surface 704 and conduction card 604 contacts a third surface 704. This allows the heat to be transferred from the conduction card 604 to the heat sink 702 through the heat transfer members 603, 605 and the conduction card 604. This eliminates or significantly reduces the amount of heat which is transferred through the force providing mechanism 708.

The multi-directional force-providing mechanism 708 is any suitable mechanism capable of exerting force in at least two distinguishable directions. In one embodiment, the multi-directional force-providing mechanism 708 includes features described in U.S. patent application Ser. No. 13/385,235, which is hereby incorporated by reference in its entirety. Additionally or alternatively, in one embodiment, the clamping mechanism is any suitable component, such as a wedge lock clamping mechanism, capable of expanding in two directions. In one embodiment, the multi-directional force-providing mechanism 708 includes contact regions 710 for contacting the movable heat transfer device 602. In addition, the multi-directional force-providing mechanism 708 includes an internal mechanism 712 permitting the multi-directional force-providing mechanism 708 to selectively or automatically exert a force upon the external contact regions 710 and, thus, to temporarily or permanently secure the moveable heat transfer device 602 in contact with the conduction card 604 and/or the heat sink 702.

The multi-directional force-providing mechanism 708 is oriented to operate in conjunction with the non-perpendicular angle(s) 706 of the heat transfer members 603, 605 of the movable heat transfer device 602. For example, in one embodiment, the multi-directional force-providing mechanism 708 has a geometry of a rectangle and is oriented at an angle relative to side surfaces 704 of the heat sink 702, as shown in FIG. 10, and at an angle relative to the plane corresponding to an insertion direction 714 for the heat transfer assembly 600. In other embodiments, the multi-directional force-providing mechanism 708 is oriented at any suitable angle relative to the insertion direction 714 to exert force evenly or disproportionately. Suitable angles include, but are not limited to, between 0 degrees and 90 degrees, between 10 degrees and 80 degrees, between 15 degrees and 75 degrees, between 30 degrees and 60 degrees, between 30 degrees and 45 degrees, between 45 degrees and 60 degrees, at or about 10 degrees, at or about 15 degrees, at or about 30 degrees, at or about 45 degrees, at or about 60 degrees, at or about 75 degrees, at or about 80 degrees, or any suitable combination, sub-combination, range, or sub-range therein.

The geometry of the components of the heat transfer assembly 600 allows force from one or two directions to urge each of the components in a plurality of directions. For example, in some embodiments, as shown in FIG. 10, an outward bi-directional force 802 is oriented to urge the conduction card 604 in a first direction 804 to directly or indirectly contact one of the surfaces 704 of the heat sink 702 and urge the movable heat transfer device 602 in a second direction 806 and a third direction 808 to directly or indirectly contact two of the surfaces 704 of the heat sink 702. The bi-directional force 802 is not parallel with first direction 804, the second direction 806, and the third direction 808. The first direction 804, the second direction 806, and the third direction 808 each extend distinguishably and are, for example, perpendicular or opposite one another. As will be appreciated, the relative orientation of the bi-directional forces, the geometry of the movable heat transfer device 602, the geometry of the conduction card 604, the geometry of the multi-directional force-providing mechanism 708, or the geometry of other components are capable of being adjusted to distribute forces, and thus, heat transfer capabilities, as desired.

Figure 11:
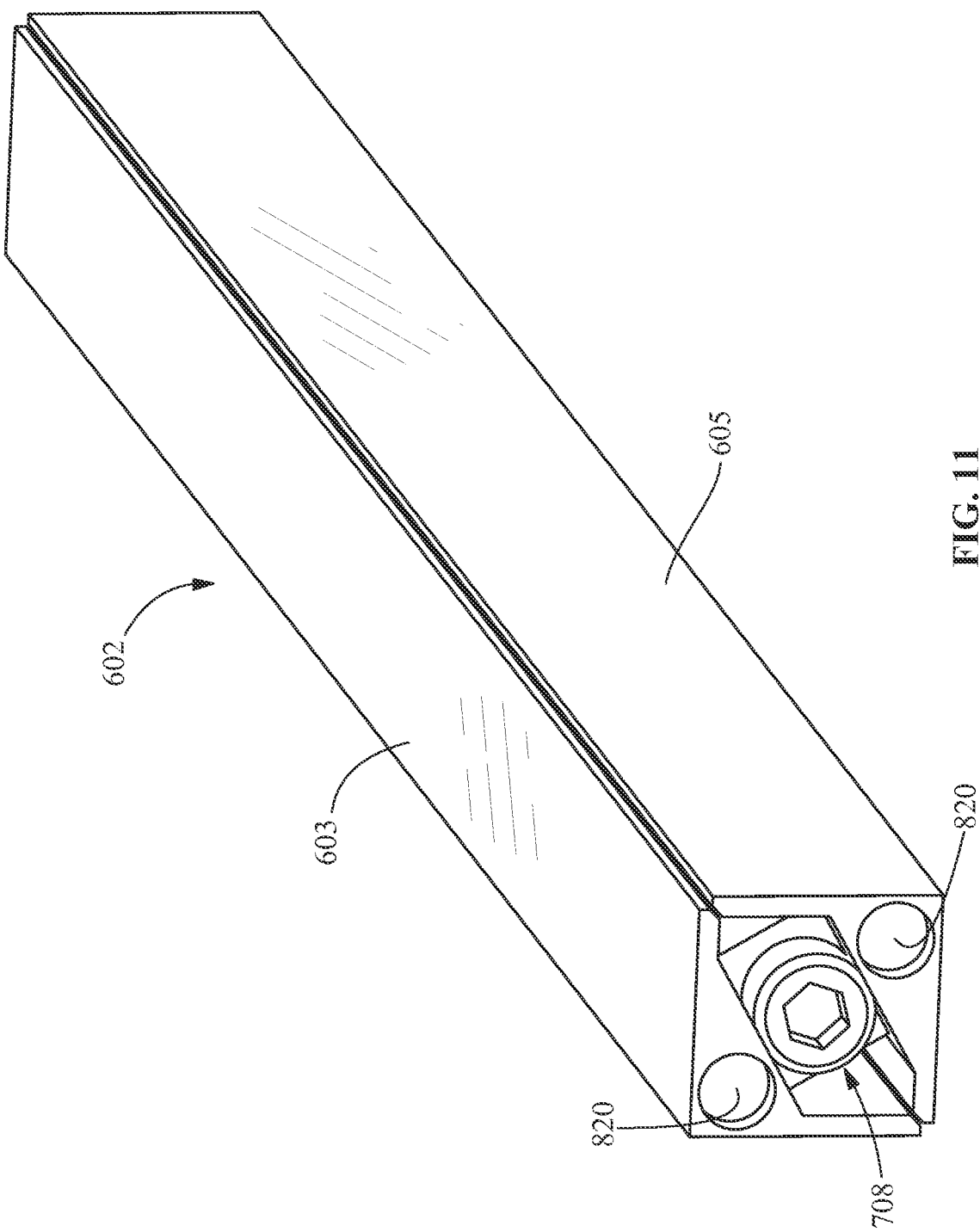
FIG. 11 is a perspective view of an embodiment of a heat transfer device, according to the disclosure.

Additionally or alternatively, in some embodiments, such as shown in FIG. 11, thermal siphon devices or thermal transport devices transports 820 may be provided or embedded in one or both heat transfer mechanisms 603, 605 to facilitate the transfer of heat from the conduction card 604 to the heat sink 702 (FIG. 10). The thermal transport devices 820, may be, but are not limited to, devices that transport thermal energy using latent heat, constant conductance heat pipes (CCHPs), thermosiphons, loop heat pipes, or any passive, two-phase device. The thermal transport devices transports 820 may extend the entire length of the heat transfer mechanism or mechanisms 603, 605, or may extend only in select regions where additional heat transfer is required.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A heat transfer assembly, comprising:
   a movable heat transfer device in contact with a heat sink; and
   a conduction card in contact with the heat sink, the conduction card being in thermal contact with the movable heat transfer device;
   a clamp having movable wedge-shaped components in the movable heat transfer device, each of the wedge-shaped components being movable in a same plane at an angle of between 10 degrees and 80 degrees relative to a corresponding surface of the conduction card parallel to an insert direction of the heat transfer assembly in the heat sink;
   a thermal transport device extending into and from the conduction card into a portion of the movable heat transfer device disposed within the heat sink device, the thermal transport device having flexible regions between the conduction card and the movable heat transfer device;
   wherein the movable heat transfer device contacts at least two surfaces of the heat sink;
   wherein the conduction card contacts at least one surface of the heat sink;
   wherein the heat transfer assembly contacts at least three surfaces of the heat sink.

2. The heat transfer assembly of claim 1, wherein the conduction card contacts at least three surfaces of the heat sink.

3. The heat transfer assembly of claim 2, wherein the contacting of heat transfer assembly to the at least three surfaces is maintained by the clamp of the heat transfer assembly.

4. The heat transfer assembly of claim 1, wherein the thermal transport device which connects the conduction card to the movable heat transfer device is one or more flexible heat pipes.

5. The heat transfer assembly of claim 2, wherein the at least three surfaces include a first surface being opposite or substantially opposite a second surface, the second surface being perpendicular to or substantially perpendicular to a third surface, and the third surface being perpendicular to or substantially perpendicular to the first surface.

6. The heat transfer assembly of claim 5, wherein the clamp exerts a force between the movable heat transfer device and the conduction card, the force being at an angle of between 10 degrees and 80 degrees with each of the first surface, the second surface, and the third surface.

7. The heat transfer assembly of claim 1, wherein the contacting of heat transfer assembly to the at least three surfaces is maintained by the heat transfer assembly having the clamp.

8. The heat transfer assembly of claim 1, wherein the movable heat transfer device has two heat transfer members with the clamp which is capable of exerting force in at least two distinguishable directions.

9. The heat transfer assembly of claim 8, wherein the two heat transfer members have at least one non-perpendicular angle for cooperating with the clamp.

10. The heat transfer assembly of claim 1, wherein a heat pipe extends through a portion of the heat conduction card and through a portion of a heat transfer member of the heat transfer device.

11. The heat transfer assembly of claim 8, wherein the at least three surfaces include a first surface being opposite or substantially opposite a second surface, the second surface being perpendicular to or substantially perpendicular to a third surface, and the third surface being perpendicular to or substantially perpendicular to the first surface.

12. The heat transfer assembly of claim 11, wherein the clamp exerts a force between the two heat transfer members, the force at an angle of between 10 degrees and 80 degrees with each of the first surface, the second surface, and the third surface.

13. A heat transfer assembly, comprising:
    a conduction card;
    a condenser in thermal contact with the conduction card, a clamp having movable wedge-shaped components positioned between the condenser and the conduction card, each of the wedge-shaped components of the clamp being movable in a same plane at an angle between 10 degrees and 80 degrees relative to a corresponding surface of the conduction card parallel to an insert direction of the heat conduction card in the heat sink;
    a thermal transport device extending into an interior portion of the condenser and from the conduction card into a portion of the condenser disposed within the condenser, the thermal transport device having flexible region between the conduction card and the condenser;
    wherein the heat transfer assembly contacts at least three surfaces of a heat sink.

14. The heat transfer assembly of claim 13, wherein the conduction card contacts at least two surfaces of the heat sink.

15. The heat transfer assembly of claim 14, wherein the contacting of heat transfer assembly to the at least three surfaces is maintained by the clamp of the heat transfer assembly.

16. The heat transfer assembly of claim 15, wherein the at least three surfaces include a first surface being opposite or substantially opposite a second surface, the second surface being perpendicular to or substantially perpendicular to a third surface, and the third surface being perpendicular to or substantially perpendicular to the first surface.

17. The heat transfer assembly of claim 16, wherein the clamp exerts a force between the movable heat transfer device and the conduction card, the force being at an angle of between 10 degrees and 80 degrees with each of the first surface, the second surface, and the third surface.

18. The heat transfer assembly of claim 14, wherein the movable heat transfer device has two heat transfer members with the clamp which is capable of exerting force in at least two distinguishable directions.

19. The heat transfer assembly of claim 18, wherein the thermal transport device is heat pipes which extend through a portion of the two heat transfer members of the heat transfer device.

20. A heat transfer process utilizing the heat transfer assembly of claim 1, comprising:

providing a heat transfer assembly comprising a conduction card and a movable heat transfer device proximal to a heat sink, the conduction card being in thermal contact with the movable heat transfer device, each wedge-shaped component of a clamp in the movable heat transfer device being movable in a same plane at an angle between 10 degrees and 80 degrees relative to a corresponding surface of the conduction card parallel to an insert direction of the heat transfer assembly in the heat sink, a thermal transport device extending into and from the conduction card into a portion of the movable heat transfer device disposed within the heat sink, the thermal transport device having flexible regions between the conduction card and the movable heat transfer device, wherein the movable heat transfer device contacts at least two surfaces of the heat sink, wherein the conduction card contacts at least one surface of the heat sink, wherein the heat transfer assembly contacts at least three surfaces of the heat sink;

transferring heat through at least three surfaces of the heat sink with a combination of the conduction card and the movable heat transfer device.

* * * * *